United States Patent
Kwon

(10) Patent No.: US 8,570,253 B2
(45) Date of Patent: Oct. 29, 2013

(54) DIGITAL/ANALOG CONVERTER, DISPLAY DEVICE USING THE SAME, AND DISPLAY PANEL AND DRIVING METHOD THEREOF

(75) Inventor: Oh-Kyong Kwon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1306 days.

(21) Appl. No.: 11/229,127

(22) Filed: Sep. 15, 2005

(65) Prior Publication Data

US 2006/0077142 A1   Apr. 13, 2006

(30) Foreign Application Priority Data

Oct. 8, 2004   (KR) .................. 10-2004-0080372

(51) Int. Cl.
*G09G 3/30* (2006.01)

(52) U.S. Cl.
USPC .............................................. 345/77; 345/76

(58) Field of Classification Search
USPC ........ 345/76–83, 88–89, 690–693; 315/169.3
See application file for complete search history.

(56) References Cited

U.S. PATENT DOCUMENTS

| | | | |
|---|---|---|---|
| 4,408,190 A | 10/1983 | Nagano | |
| 5,451,946 A | 9/1995 | Smith et al. | |
| 5,844,511 A * | 12/1998 | Izumikawa | 341/136 |
| 6,344,857 B1 | 2/2002 | Matono et al. | |
| 7,034,787 B2 * | 4/2006 | Date et al. | 345/89 |
| 7,221,349 B2 * | 5/2007 | Hashido et al. | 345/89 |
| 7,242,378 B2 * | 7/2007 | Okabe et al. | 345/77 |
| 7,289,087 B2 * | 10/2007 | Date | 345/76 |
| 7,304,654 B2 * | 12/2007 | Mori et al. | 345/690 |
| 7,535,397 B1 * | 5/2009 | Chiou et al. | 341/145 |
| 7,903,127 B2 * | 3/2011 | Kwon | 345/690 |
| 2002/0044110 A1 * | 4/2002 | Prache | 345/82 |
| 2003/0058199 A1 | 3/2003 | Kasai | |

(Continued)

FOREIGN PATENT DOCUMENTS

| | | |
|---|---|---|
| CN | 1432985 A | 7/2003 |
| JP | 59-023622 A | 2/1984 |

(Continued)

OTHER PUBLICATIONS

Korean Patent Abstracts, Publication No. 1020020046756 A; Date of Publication: Jun. 21, 2002; in the name of Seong Jun Bae et al.

(Continued)

*Primary Examiner* — Alexander Eisen
*Assistant Examiner* — Nelson Lam
(74) *Attorney, Agent, or Firm* — Christie, Parker & Hale, LLP

(57) ABSTRACT

A digital/analog (D/A) converter, a light emitting display device using the converter, and a display panel and a driving method thereof. The display device according to an exemplary embodiment of the present invention includes: a display unit having a plurality of data lines for transmitting data currents, a plurality of scan lines for transmitting selection signals, and a plurality of pixel areas defined by the data lines and the scan lines; a data driver for dividing a plurality of grayscale data having a first data and a second data into at least two grayscale sections, converting the grayscale data into a data current, and applying the data current to a data line; and a scan driver for sequentially applying the selection signals to the plurality of scan lines.

20 Claims, 9 Drawing Sheets

(56) References Cited

U.S. PATENT DOCUMENTS

| | | | |
|---|---|---|---|
| 2003/0156104 A1* | 8/2003 | Morita | 345/204 |
| 2004/0046720 A1* | 3/2004 | Nagai et al. | 345/82 |
| 2004/0201556 A1* | 10/2004 | Oomori et al. | 345/76 |
| 2004/0222985 A1* | 11/2004 | Kimura | 345/212 |
| 2005/0001858 A1* | 1/2005 | Morita et al. | 345/690 |
| 2005/0030214 A1* | 2/2005 | Jo | 341/145 |
| 2005/0057457 A1 | 3/2005 | Date | |
| 2005/0099328 A1* | 5/2005 | Kasai | 341/144 |
| 2005/0156635 A1* | 7/2005 | Yoneyama et al. | 327/108 |
| 2005/0156834 A1 | 7/2005 | Jo et al. | |
| 2005/0156836 A1* | 7/2005 | Yoneyama et al. | 345/76 |
| 2006/0023001 A1* | 2/2006 | Sung et al. | 345/690 |
| 2006/0066538 A1* | 3/2006 | Kasai et al. | 345/77 |
| 2006/0077143 A1* | 4/2006 | Kwon | 345/77 |
| 2006/0164353 A1* | 7/2006 | Nakajima et al. | 345/89 |
| 2007/0152934 A1 | 7/2007 | Maeda | |

FOREIGN PATENT DOCUMENTS

| | | |
|---|---|---|
| JP | 59-34191 | 9/1984 |
| JP | 61-295721 A | 12/1986 |
| JP | 08-084307 A | 3/1996 |
| JP | 10-093436 A | 4/1998 |
| JP | 2000-122608 A | 4/2000 |
| JP | 2000-338935 | 12/2000 |
| JP | 2003-150115 A | 5/2003 |
| JP | 2003-255898 A | 9/2003 |
| JP | 2004-078163 A | 3/2004 |
| JP | 2004-112183 A | 4/2004 |
| JP | 2004-252419 | 9/2004 |
| JP | 2004-361489 A | 12/2004 |
| KR | 2002-0046756 | 6/2002 |
| KR | 10-2004-0075716 | 8/2004 |

OTHER PUBLICATIONS

Korean Patent Abstracts, Publication No. 1020040075716 A; Date of Publication: Aug. 30, 2004; in the name of Hiroaki Jo.

U.S. Office action dated Oct. 14, 2008, for related U.S. Appl. No. 11/229,460.

U.S. Office action dated Apr. 27, 2009 for related U.S. Appl. No. 11/229,460.

U.S. Office action dated Mar. 15, 2010, for related U.S. Appl. No. 11/229,460.

* cited by examiner

DIGITAL/ANALOG CONVERTER, DISPLAY DEVICE USING THE SAME, AND DISPLAY PANEL AND DRIVING METHOD THEREOF

CROSS-REFERENCE TO RELATED APPLICATION

This application claims priority to and the benefit of Korean Patent Application No. 10-2004-0080372, filed in the Korean Intellectual Property Office on Oct. 8, 2004, the entire content of which is incorporated herein by reference.

BACKGROUND OF THE INVENTION

1. Field of the Invention

The present invention relates to a display device. More particularly, the present invention relates to a digital/analog (D/A) converter, a light emitting display device using the converter, and a display panel and a driving method thereof.

2. Description of the Related Art

In general, an organic light emitting diode (OLED) display is a display device that electrically excites a phosphorous organic compound to emit light, and it voltage- or current-programs N×M organic light emitting pixels to display images. An organic light emitting pixel (or diode) of the OLED display includes an anode, an organic thin film, and a cathode. The organic thin film has a multi-layer structure including an emitting layer (EML), an electron transport layer (ETL), and a hole transport layer (HTL) for maintaining balance between electrons and holes to improve emitting efficiencies, and it further includes an electron injecting layer (EIL) and a hole injecting layer (HIL).

Methods for driving the organic light emitting pixels include a passive matrix method, and an active matrix method using thin film transistors (TFTs) or MOSFETs. The passive matrix method forms cathodes and anodes to cross with each other, and lines are selected to drive the organic light emitting pixels. The active matrix method couples a TFT and a capacitor to each indium tin oxide (ITO) pixel electrode, and an organic light emitting pixel is driven by a voltage maintained by capacitance of a capacitor. The active matrix method can be classified as a voltage programming method or a current programming method depending on forms of signals supplied for programming a voltage to a capacitor.

It is difficult for a conventional voltage-programming pixel circuit to obtain high gray scales because of deviations of threshold voltages (VTHs) of TFTs and/or mobilities of carriers of the TFTs caused by non-uniformity of a manufacturing process. However, if a current source can supply a substantially uniform current to pixel circuits over a whole data line, a pixel circuit of a current programming method generates uniform display characteristics even when a driving transistor in each pixel has non-uniform voltage-current characteristics.

A digital/analog (D/A) converter, which converts grayscale data into a grayscale current and applies it to a pixel circuit, is necessary in a display device of a current programming pixel, and the D/A converter should correct a gamma characteristic of the grayscale data in consideration of a characteristic of a display panel when converting the grayscale data into the grayscale current.

However, although the gamma characteristic of the display panel is nonlinear with respect to the grayscale data, a conventional D/A converter outputs a grayscale current that is linear with respect to the grayscale data. Accordingly, a desired grayscale image is not displayed in a display panel, and image quality becomes poor.

The information disclosed in this Background of the Invention section is only for enhancement of understanding of the background of the invention and therefore, unless explicitly described to the contrary, it should not be taken as an acknowledgment or any form of suggestion that this information forms the prior art that is already known in this country to a person skilled in the art.

SUMMARY OF THE INVENTION

An embodiment of the present invention provides a digital/analog (D/A) converter for outputting a gamma corrected grayscale current, a display device using the converter, and a display panel and a driving method thereof.

An exemplary display device according to an embodiment of the present invention includes a display unit, a data driver, and a scan driver.

The display unit includes a plurality of data lines for transmitting data currents, a plurality of scan lines for transmitting selection signals, and a plurality of pixel areas defined by the respective data lines and scan lines.

The data driver dividing a plurality of grayscale data including a first data and a second data into at least two grayscale sections, converts the grayscale data into a data current, and applies the data current to a data line.

The scan driver sequentially applies the selection signals to the plurality of scan lines.

Here, the data driver outputs a first current corresponding to a first grayscale section indicated by at least one of the grayscale data among the plurality of grayscale sections by using the first data, outputs a second current corresponding to the first grayscale section by using the second data, divides the first grayscale section into a first group of the grayscale data and a second group of the grayscale data, divides the grayscale data into the two groups, and differently controls a variation of the second current according to the grayscale data in the first group of the grayscale data and the second group of the grayscale data.

In another embodiment of the display device, the first data is a high-order bit data of the grayscale data, and the second data is a low-order bit data of the grayscale data.

In a further embodiment of the display device, the first current is an initial current for the first grayscale section.

In a still further embodiment of the display device, the first grayscale section is a lowermost grayscale section among the at least two grayscale sections.

In a still further embodiment of the display device, in the first grayscale section, the first group of the grayscale data is a low grayscale data group, and the second group of the grayscale data is a high grayscale data group.

In a still further embodiment of the display device, the variation of the second current in the second group of the grayscale data is set to be double the respective variation of the second current in the first group of the grayscale data.

In a still further embodiment of the display device, the data driver includes a shift register, a latch, and a grayscale current.

The shift register receives a first signal and a clock signal, and shifts the first signal in synchronization with the clock signal into a plurality of shifted signals.

The latch latches the plurality of grayscale data in synchronization with the respective shifted signals from the shift register.

The grayscale current generator converts the plurality of grayscale data output from the latch into the data currents and outputs the data currents.

In a still further embodiment of the display device, the grayscale current generator includes a first current output unit, a multiplexer, and a second current output unit.

The first current output unit outputs the first current corresponding to the first grayscale section by using the first data.

The multiplexer selects a first reference voltage corresponding to the first grayscale section from a plurality of first voltages respectively corresponding to unit currents of the grayscale sections and outputs the first reference voltage.

The second current output unit sets up the variation of the second current according to the second data in the first group of the grayscale data and the second group of the grayscale data, and outputs the second current by using the second data and the first reference voltage output from the multiplexer.

In a still further embodiment of the display device, the first current output unit includes a plurality of first transistors, and a plurality of first switches.

The plurality of first transistors respectively output a plurality of third currents corresponding to a second voltage.

The plurality of first switches respond to the first data and output the third currents from the first transistors as the first current.

In a still further embodiment of the display device, the second voltage is substantially the same as the first reference voltage, the third currents are substantially the same as respective current periods of the grayscale sections, and the first current is substantially the same as a sum of the third currents.

In a still further embodiment of the display device, the second current output unit includes a plurality of transistor groups, a plurality of second switches, and a third switch.

Each of the plurality of transistor groups includes two transistors respectively outputting substantially the same fourth currents in response to the first reference voltage output by the multiplexer.

The plurality of the second switches respond to the second data and output currents of the transistors from the second transistor groups as the second current.

The third switch is coupled with one of the two transistors in a second transistor group and a second switch.

In a still further embodiment of the display device, the currents output from the respective second transistor groups are respectively set to be different from each other.

In a still further embodiment of the display device, the second switches, which output the currents of the transistors included in the same second transistor group, are turned on simultaneously.

In a still further embodiment of the display device, the third switches are controlled to be all turned off when the grayscale data in the first group of the grayscale data is input, and some of the third switches are controlled to be turned on when the grayscale data of the second group of the grayscale data is input.

In a still further embodiment of the display device, the plurality of the third switches are controlled to be turned on in all grayscale sections except the first grayscale section.

An exemplary display panel according to an embodiment of the present invention includes a display unit and a grayscale current generator.

The display unit includes a plurality of pixels for displaying images according to an applied data current.

The grayscale current generator divides a plurality of grayscale data including a first data and a second data into at least two grayscale sections, converts at least one of the grayscale data into the data current, and applies the data current to a data line.

Here the grayscale current generator generates a first current corresponding to a first grayscale section of the at least two grayscale sections by using the first data and to which the at least one of the grayscale data belongs, generates a second current corresponding to the second data in the first grayscale section, divides the first grayscale section into at least two sub-grayscale sections by using the second data, and differently controls a variation of the second current according to the second data in each sub-grayscale section.

In another embodiment of the display panel, the first current is an initial current for the first grayscale section, and the variation of the second current corresponds to the second data.

In a further embodiment of the display panel, among the at least two sub-grayscale sections, a variation of the second current in a low grayscale section is controlled to be smaller than a variation in a high grayscale section.

In a still further embodiment of the display panel, the grayscale current generator includes a first current output unit, a multiplexer, and a second current output unit.

The first current output unit outputs the first current corresponding to the first grayscale section by using the first data.

The multiplexer selects a first reference voltage corresponding to the first grayscale section from a plurality of first voltages respectively corresponding to unit currents of the grayscale sections and outputs the first reference voltage.

The second current output unit sets up the variations of the second current in the sub-grayscale sections, and outputs the second current by using the second data and the first voltage output from the multiplexer.

An exemplary D/A converter according to an embodiment of the present invention, which converts a plurality of grayscale data into grayscale currents and outputs them by dividing a grayscale section into at least two grayscale sections including a first grayscale section, includes a first current output unit, a multiplexer, and a second current output unit.

The first current output unit outputs a first current corresponding to the first grayscale section by using a first data among the grayscale data.

The multiplexer selects a first reference voltage of the first grayscale section from a plurality of first voltages respectively corresponding to unit currents of the grayscale sections and outputs the first reference voltage.

The second current output unit divides the first grayscale section into at least two sub-grayscale sections and outputs a second current by using a second data among the grayscale data and the first reference voltage output from the multiplexer.

Here, the second current output unit differently controls a variation of the second current according to the second data in the at least two sub-grayscale sections included in the first grayscale section.

In another embodiment of the D/A converter, the first grayscale section is the lowest grayscale section among the plurality of grayscale sections.

In a further embodiment of the D/A converter, among the at least two sub-grayscale sections, the variation of the second current in a low grayscale section is controlled to be smaller than the variation in a high grayscale section.

An exemplary D/A converter according to the present invention, which converts a plurality of grayscale data into grayscale currents and outputs them, includes a reference current output unit, a multiplexer, a fine current output unit, and a switch.

The reference current output unit outputs a plurality of reference currents by using a first data among the grayscale data.

The multiplexer receives respective unit currents corresponding to the plurality of reference currents and selectively outputs a corresponding one of the unit currents on the basis of the first data.

The fine current output unit outputs a plurality of fine currents based on the unit current output by the multiplexer and a second data other than the first data among the grayscale data.

The switch is turned on based on the second data and selectively transmits the plurality of fine currents output by the fine current output unit to an output terminal.

Here, the grayscale current belongs to one of a plurality of grayscale current sections divided on the basis of the plurality of reference currents, a first grayscale current section among the plurality of grayscale current sections is divided into at least two sub-grayscale current sections, and the switch differently controls variations of the fine currents from the at least two sub-grayscale current sections.

In another embodiment of the D/A converter, the fine current output unit includes first, second, third, fourth, fifth, sixth, seventh, and eighth transistors.

The first and second transistors output a first current in response to the unit current output by the multiplexer and to a first bit of the second data.

The third and fourth transistors output a second current in response to the unit current output by the multiplexer and to a second bit of the second data.

The fifth and sixth transistors output a third current in response to the unit current output by the multiplexer and to a third bit of the second data.

The seventh and eighth transistors output a fourth current in response to the unit current output by the multiplexer and to a fourth bit of the second data.

In a further embodiment of the D/A converter, the switch includes a first switch, a second switch, and a third switch.

The first switch is turned on in response to the fourth bit of the second data, and couples the second transistor with the output terminal.

The second switch is turned on in response to the fourth bit of the second data, and couples the fourth transistor with the output terminal.

The third switch is turned on in response to the fourth bit of the second data, and couples the sixth transistor with the output terminal.

In a still further embodiment of the D/A converter, the switch includes a fourth switch, a fifth switch, a sixth switch, and a seventh switch.

The fourth switch couples the second transistor with the output terminal according to the first data.

The fifth switch couples the fourth transistor with the output terminal according to the first data.

The sixth switch couples the sixth transistor with the output terminal according to the first data.

The seventh switch couples the eighth transistor with the output terminal according to the first data.

According to an embodiment of the present invention, an exemplary driving method of a display panel in which a plurality of pixel circuits for displaying images in response to an input data current are formed, wherein a plurality of grayscale data are divided into at least two grayscale sections including a first grayscale section, and the first grayscale section includes two sub-grayscale sections, the method including a first part, a second part, a third part, and a fourth part.

The first part generates a first current corresponding to the first grayscale section to which at least one of the grayscale data belongs by using a first data of the grayscale data.

The second part selectively outputs a first reference signal of the first grayscale section among first signals respectively corresponding to the at least two grayscale sections.

The third part generates a third current corresponding to the first reference signal and generating a second current by using the third current and a second data of the grayscale data.

The fourth part combines the first current and the second current and outputs them as the data current, wherein a variation of the second current according to the second data is differently controlled in the at least two sub-grayscale sections.

In another embodiment of the driving method, the first reference signal is a voltage corresponding to a unit current of the first grayscale section.

DETAILED DESCRIPTION

Figure 1:
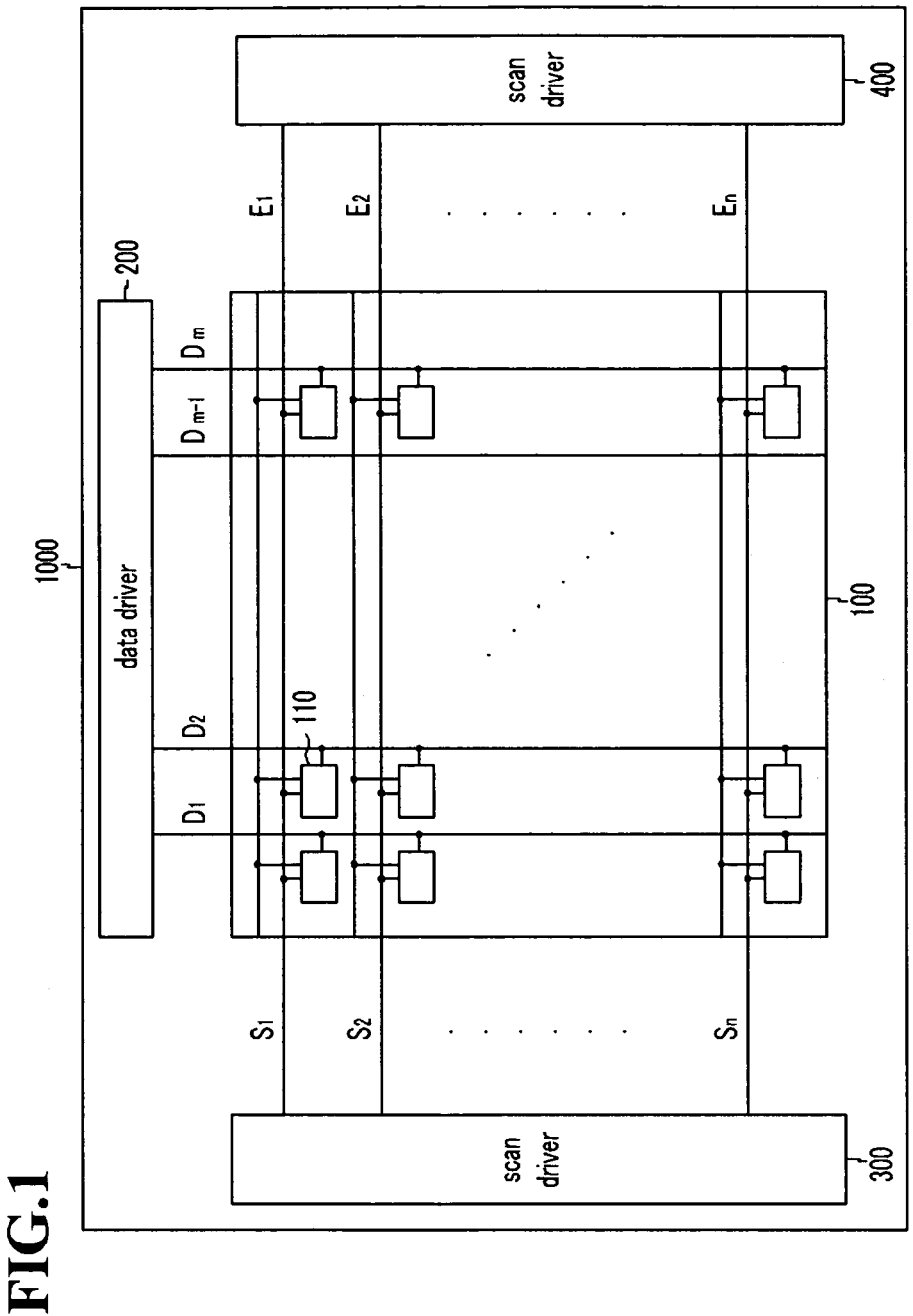
FIG. 1 is a top plan view showing an OLED display according to an embodiment of the present invention.

Certain embodiments of the present invention will hereinafter be described in detail with reference to the accompanying drawings.

In the following description, when it is described that an element is coupled to another element, the element may be directly coupled to the other element or coupled to the other element through a third element. Like reference numerals designate like elements throughout the specification and the drawings. The drawings and description are to be regarded as illustrative in nature and not restrictive.

In the following description according to the embodiments of the present invention, an organic light emitting diode display (hereinafter, OLED display) using an electro-luminescence of organic material will be exemplified as a display device.

FIG. 1 is a top plan view showing an OLED display according to an embodiment of the present invention.

As shown in FIG. 1, the OLED display according to an embodiment of the present invention includes a substrate 1000 for forming a display panel. The substrate 1000 includes a display unit 100 on which an actual image is displayed and a periphery on which no image is displayed. On the periphery, a data driver 200, and scan drivers 300 and 400 are formed.

The display unit 100 includes a plurality of data lines $D_1$ to $D_m$, a plurality of scan lines $S_1$ to $S_n$, a plurality of light emission control lines $E_1$ to En, and a plurality of pixels 110. The data lines $D_1$ to $D_m$ are extended in a column direction, and are for transmitting a data current for representing an image to a pixel 110. The scan lines $S_1$ to $S_n$ and the light emission control lines $E_1$ to En are extended in a row direction, and respectively are for transmitting a scan signal and a light emission control signal to the pixel 110. A pixel area is defined by one data line and one scan line.

The data driver 200 applies the data current (or a plurality of data currents) to the data lines $D_1$ to $D_m$. The scan driver 300 sequentially applies the scan signal (or a plurality of scan signals) to the plurality of scan lines $S_1$ to $S_n$, and the scan driver 400 sequentially applies the light emission control signal (or a plurality of light emission control signals) to the plurality of light emission control lines $E_1$ to En.

The data driver 200 and/or scan driver 300 and 400 are directly built on the substrate 1000 in the form of an integrated circuit. Alternatively, the drivers 200, 300, and/or 400 may be formed on the same layer of the substrate 1000 on which the data lines $D_1$ to $D_m$, scan lines $S_1$ to $S_n$, light emission control lines $E_1$ to $E_n$, and transistors of the pixels (or pixel circuits) are formed. Alternatively, the drivers 200, 300, and/or 400 may be formed on a substrate separated from the substrate 1000, and the separated substrate may be coupled with the substrate 1000, or the drivers may be adhesively built on the substrate 1000 in the form of a chip coupled with a tape carrier package (TCP), a flexible printed circuit (FPC), or a tape automatic bonding (TAB).

Figure 2:
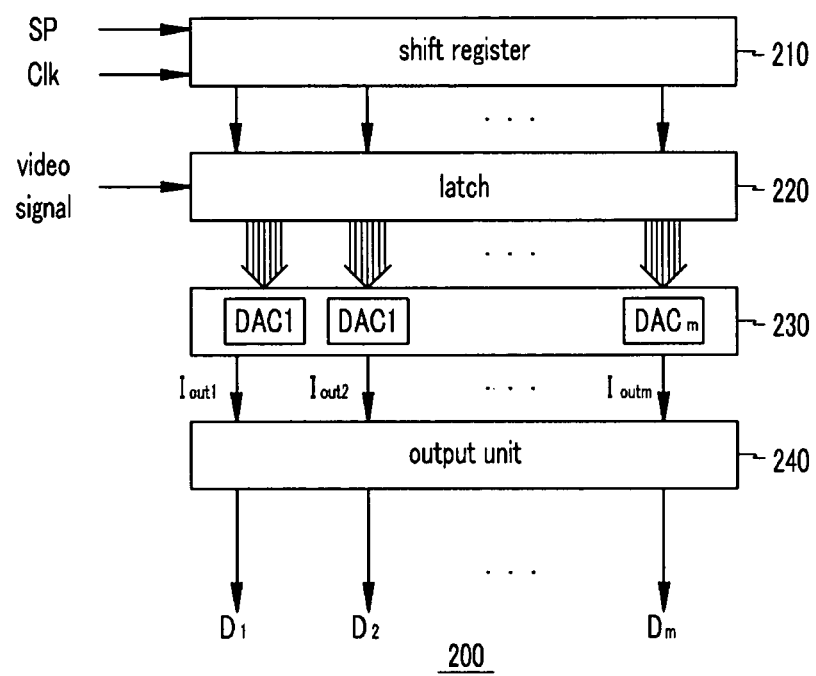
FIG. 2 is a block diagram showing a data driver according to an embodiment of the present invention.

FIG. 2 is a block diagram showing the data driver 200 according to an embodiment of the present invention.

As shown in FIG. 2, the data driver 200 according to an embodiment of the present invention includes a shift register 210, a latch 220, a grayscale current generator 230, and an output unit 240.

The shift register 210 sequentially shifts a start signal SP in synchronization with a clock signal Clk and outputs the start signal SP as a plurality of shifted start signals. The latch 220 latches a plurality of video signals in synchronization with the output signals of the shift register 210, and outputs the video signals.

The grayscale current generator 230 receives the video signals output from the latch 220, and generates grayscale currents $I_{out1}$ to $I_{outm}$ corresponding to the video signals. According to an embodiment of the present invention, the grayscale current generator 230 includes a plurality of D/A converters $DAC_1$ to $DAC_m$. Each D/A converter $DAC_1$ to $DAC_m$ converts a respective one of the input digital video signals into a respective one of the grayscale currents $I_{out1}$ to $I_{outm}$, and outputs it.

The output unit 240 applies the grayscale currents $I_{out1}$ to $I_{outm}$ output from the grayscale current generator 230 to the data lines $D_1$ to $D_m$, respectively. The output unit 240 may be formed as a buffer circuit which is coupled with the D/A converters $DAC_1$ to $DAC_m$ included in the grayscale current generator 230 and the data lines $D_1$ to $D_m$, and is placed therebetween.

Figure 3:
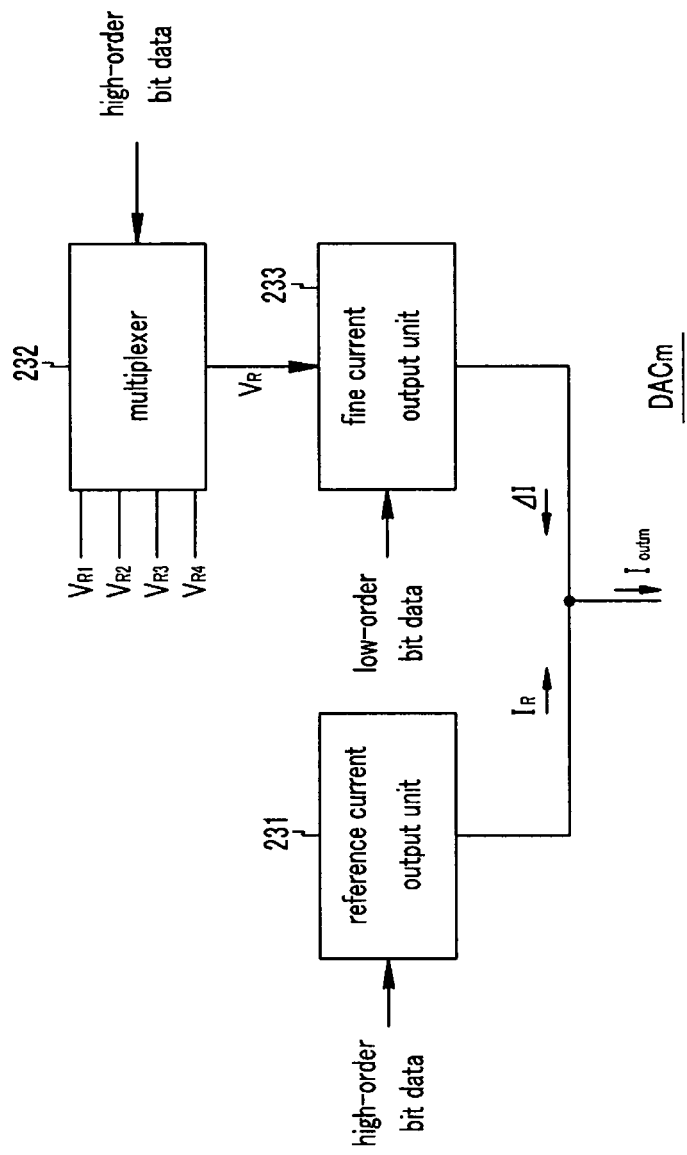
FIG. 3 is a block diagram showing a D/A converter of a grayscale current generator according to a first embodiment of the present invention.
Figure 4:
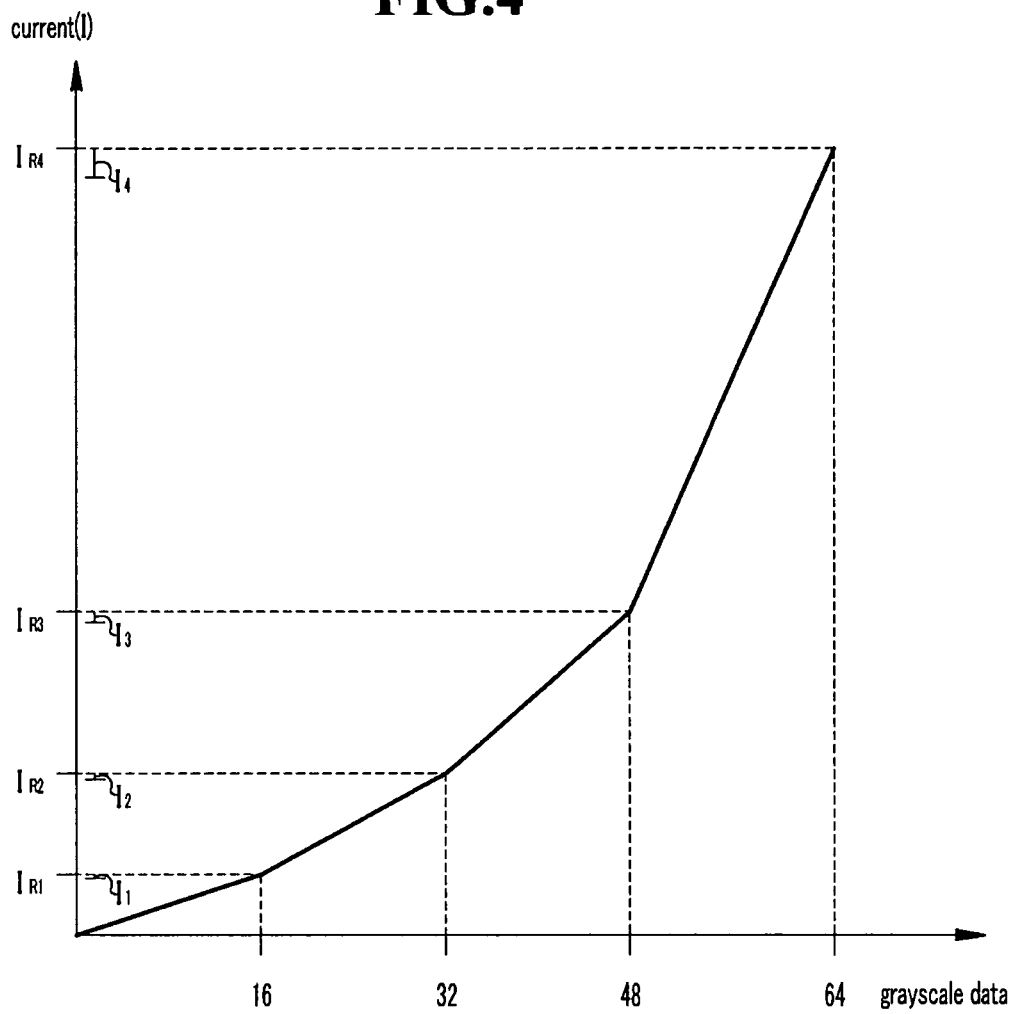
FIG. 4 shows a gamma curve according to the first embodiment of the present invention.
Figure 5:
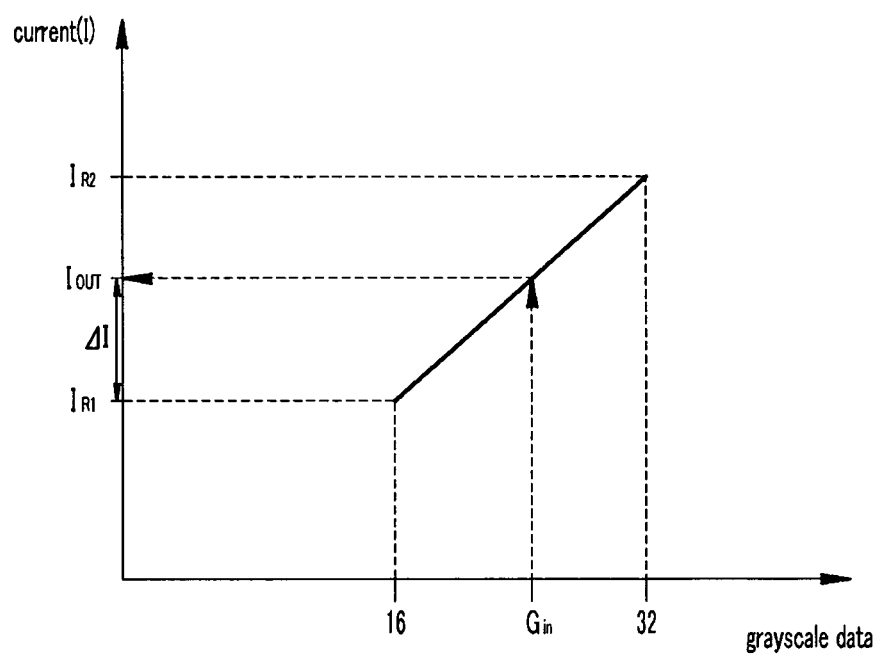
FIG. 5 shows a section corresponding to a second grayscale section of the gamma curve in FIG. 4.

Referring to FIGS. 3, 4, and 5, a grayscale current generator (e.g., the grayscale current generator 230) according to a first embodiment of the present invention will be described. For a better understanding and ease of description, a video signal is assumed to be a grayscale data of 6 bits, but the present invention is not thereby limited.

FIG. 3 is a block diagram showing the D/A converter of the grayscale current generator according to the first embodiment of the present invention, and representatively describes the D/A converter $DAC_m$. FIG. 4 shows a gamma curve according to the first embodiment of the present invention. FIG. 5 is an exemplary diagram for an outputting grayscale current in a case of inputting a grayscale data of a second grayscale section of the gamma curve in FIG. 4.

As shown in FIG. 3, the D/A converter $DAC_m$ according to the first embodiment of the present invention includes a reference current output unit 231, a multiplexer 232, and a fine current output unit 233.

The reference current output unit 231 receives a high-order bit data of the grayscale data, and outputs a reference current IR. The multiplexer 232 selects a reference voltage VR corresponding to the high-order bit data, and transmits it to the fine current output unit 233. The fine current output unit 233 receives the reference voltage VR, and outputs a fine current $\Delta I$ corresponding to a low-order bit data of the grayscale data.

The grayscale current generator 230 according to the first embodiment of the present invention divides the gamma curve into a plurality of grayscale sections as shown FIG. 4. The reference current output unit 231 outputs reference currents IR1 to IR3 or an offset current by using the high-order bit data of the grayscale data. The fine current output unit 233 outputs the fine current $\Delta I$ corresponding to the low-order bit data of the grayscale data.

The fine current $\Delta I$ can be calculated by multiplying respective unit currents $I_1$ to $I_4$ of grayscale sections and the low-order bit data. The respective slopes for the first to the fourth grayscale sections of the gamma curve are different, so the unit currents $I_1$ to $I_4$ have different values. That is, the multiplexer 232 selects the respective reference voltages VR1 to VR4 of the grayscale sections to which the grayscale data belongs, and transmits the selected reference voltage VR to the fine current output unit 233, and the fine current output unit 233 outputs the fine current $\Delta I$ by using the unit current I and the low-order bit data of the grayscale data of the grayscale section to which the grayscale data belongs.

In more detail, when a grayscale data $G_{in}$ in the second grayscale section is input as shown in FIG. 5, the reference current output unit 231 outputs the reference current IR1 corresponding to a high-order bit data of the grayscale data. The multiplexer 232 transmits the reference voltage VR2 of the second grayscale section to the fine current output unit 233, and the fine current output unit 233 outputs the fine current $\Delta I$ by using a low-order bit data of the grayscale data $G_{in}$. For example, when the grayscale data $G_{in}$ is 25 (011001), the reference current output unit 231 outputs the reference current IR1 corresponding to the high-order bit data 16 (01), the multiplexer 232 outputs the reference voltage VR2, and the fine current output unit 233 outputs a current that is 9 times the unit current $I_2$.

As described above, a plurality of grayscale data is divided into four grayscale sections, so that the grayscale current generator 230 may output the grayscale current satisfying the nonlinear gamma characteristic. In other words, the gray scale current generator 230 may respectively control a current variation of the grayscale current with respect to the divided grayscale sections.

Hereinafter, referring to FIG. 6, an inner structure of a D/A converter (e.g., the D/A converter $DAC_m$) according to the first embodiment of the present invention will be described in more detail.

Figure 6:
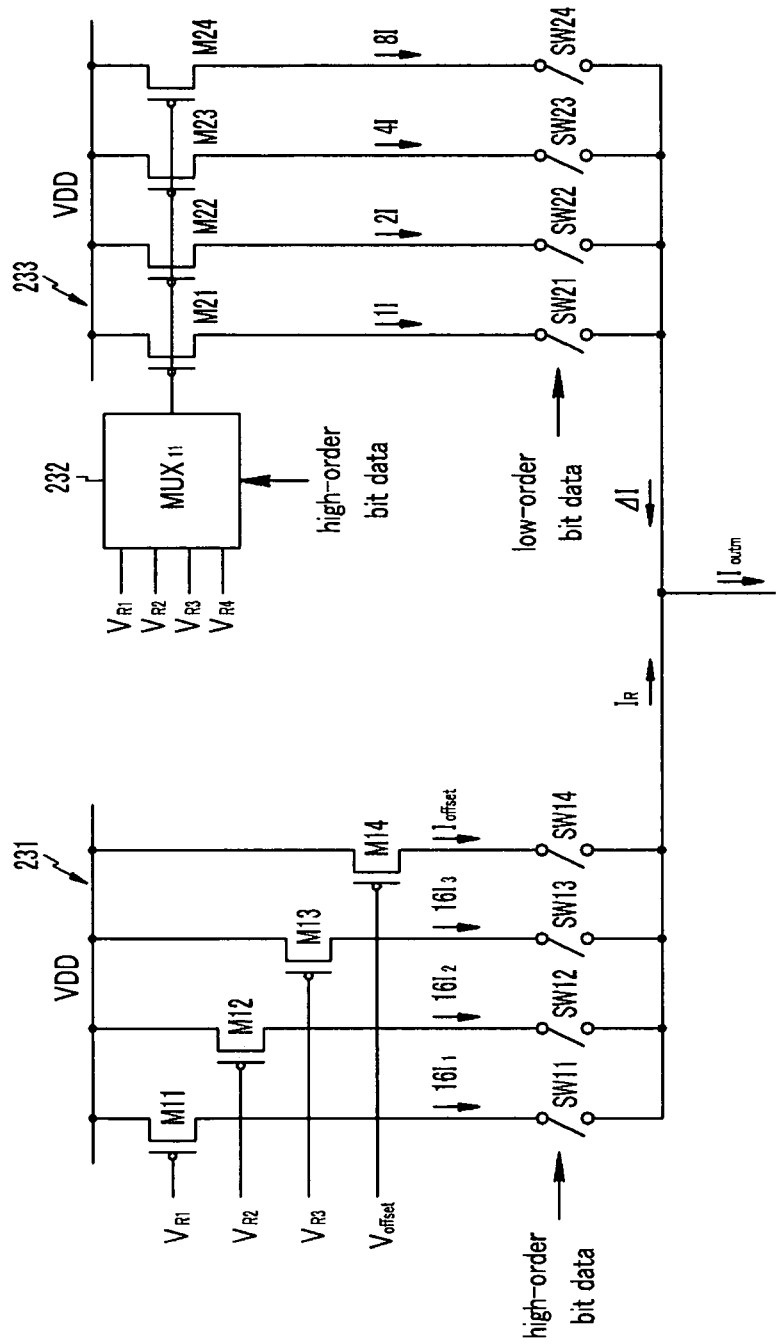
FIG. 6 is a circuit diagram showing the D/A converter according to the first embodiment of the present invention.

FIG. 6 is a circuit diagram showing the D/A converter according to the first embodiment of the present invention.

As shown in FIG. 6, the reference current output unit 231 includes four transistors M11 to M14 and four switches SW11 to SW14, receives the high-order bit data of the grayscale data, and outputs the reference current IR.

The reference voltages VR1 to VR3 and an offset voltage $V_{offset}$ are applied respectively to gates of the transistors M11 to M14, and sources of the transistors M11 to M14 are coupled to a power source VDD. The switches SW11 to SW14 are coupled to respective drains of the transistors M11 to M14, and are controlled to be turned on/off according to the high-order bit data of the grayscale data.

The channel widths and the channel lengths (e.g., the sizes or the aspect ratios) of the transistors M11 to M13 are set up in order that the transistors M11 to M13 may respectively output currents which are 16 times the unit currents $I_1$, $I_2$, and $I_3$ in response to the reference voltages VR1, VR2, and VR3, respectively. The channel width and the channel length of the transistor M14 are set up in order that the transistor M14 may output the offset current $I_{offset}$ corresponding to grayscale data 0 in response to the offset voltage $V_{offset}$.

When the high-order bit data of the grayscale data is '00', the switch SW14 is turned on and an offset current $I_{offset}$ is output, and when the high-order bit data is '01', the switch SW11 is turned on and the reference current IR1, which is 16 times that of the unit current $I_1$, is output.

When the high-order bit data is '10', the switches SW11 and SW12 are turned on, and the reference current IR2 shown in Equation 1 is output, and when the high-order bit data is '11', the switches SW11, SW12, and SW13 are turned on and the reference current IR3 shown in Equation 2 is output.

$$I_{R2}=16\times I_1+16\times I_2 \quad \text{[Equation 1]}$$

$$I_{R3}=16\times I_1+16\times I_2+16\times I_3 \quad \text{[Equation 2]}$$

In addition, when the high-order bit data of the grayscale data is '00', it is not necessary to output a current, so the offset current $I_{offset}$ may be output when the high-order bit data is '01' (and not when the high-order bit data is '00'). Hereinafter, however, only a case of outputting the offset current $I_{offset}$ when the high-order bit data is '00' will be described in more detail. That is, the multiplexer 232 receives the high-order bit data of the grayscale data, selects a corresponding reference voltage from four reference voltages VR1 to VR4, and then transmits the selected reference voltage to the fine current output unit 233. In more detail, the multiplexer 232 outputs the reference voltage VR1 corresponding to the unit current $I_1$ of the first grayscale section when the high-order bit data is '00', and respectively outputs reference voltages VR2 to VR4 corresponding to the current $I_2$, $I_3$, or $I_4$ of the second to the fourth grayscale sections when the high-order bit data is '01', '10', or '11'.

The fine current output unit 233 includes four transistors M21 to M24 and four switches SW21 to SW24.

The transistors M21 to M24 output respective currents corresponding to the reference voltages VR output by the multiplexer 232, and the switches SW21 to SW24 are turned on in response to the low-order bit data of the grayscale data.

According to an embodiment of the present invention, the channel width and the channel length of the transistor M21 are set up in order that the transistor M21 may output the unit current I of the grayscale section corresponding to the reference voltage VR, and the channel widths and the channel lengths of the transistors M22 to M24 are set up in order that the transistors M22 to M24 may respectively output the currents which are 2 times, 4 times, and 8 times the unit current I.

In more detail, the ratio between the channel width and the channel length (W/L) of the transistor M21 is set to be $1/16$ times the ratio of each of the transistors M11 to M14, and the ratios of the transistors M22 to M24 are respectively set to be 2 times, 4 times, and 8 times the ratio of the transistor M21.

Accordingly, when the grayscale data of the first grayscale section is input, the multiplexer 232 selects the reference voltage VR1, and transmits it to the fine current output unit 233, and the switches SW21 to SW24 are turned on/off in accordance with the low-order bit data of the grayscale data, so that the current which is 0 to 15 times the unit current $I_1$ may be output as the fine current $\Delta I$.

Similarly, when the grayscale data of the second to the fourth grayscale sections are input, the multiplexer 232 selects a reference voltage from the reference voltages VR2 to VR4, and transmits it to the fine current output unit 233, and the switches SW21 to SW24 are turned on/off in accordance with the low-order bit data of the grayscale data, so that the current which is 0 to 15 times the respective unit currents $I_2$ to $I_4$ may be output as the fine current $\Delta I$.

As described above, the grayscale data is divided into a plurality of grayscale sections by using the high-order bit data of the grayscale data, and the fine current $\Delta I$ belonging to the grayscale section to which the grayscale data corresponds is output by using the low-order bit data. Thereby, it becomes possible to output a grayscale current to which the non-linear gamma characteristic is reflected.

However, it is still difficult to output the grayscale current satisfying the ideal gamma characteristic because the gamma curve is linear in each grayscale section for the D/A converter according to the first embodiment of the present invention. In particular, in the low grayscale section (e.g., the first grayscale section) in which the nonlinearity of the gamma curve is relatively large, the gamma correction may not be performed sufficiently to output a desired grayscale current.

Therefore, in a second embodiment of the present invention, the first grayscale section is further divided into two sub-grayscale sections. Then, in a lower grayscale section of the two sub-grayscale sections, a current variation according to the grayscale data is set to be smaller, whereas in the higher grayscale section, the current variation is set to be larger. Accordingly, more accurate gamma correction can be accomplished in the first grayscale section.

Hereinafter, referring to FIG. 7, a D/A converter (e.g., the D/A converter $DAC_m$) according to the second embodiment of the present invention will be described.

The D/A converter (e.g., the D/A converter $DAC_m$) according to the second embodiment of the present invention includes a reference current output unit 231', a multiplexer 232', and a fine current output unit 233'.

The reference current output unit 231' includes four transistors M11' to M14', and four switches SW11' to SW14'. The channel width and the channel length of the transistor M11' is set up in order that the transistor M11' may output the current which is 12 times the unit current $I_1$, and the channel widths and the channel lengths of the transistors M12' and M13' are set up in order that the transistors M12' and M13' may respectively output the currents which are 16 times the unit currents $I_2$ and $I_3$. The channel width and the channel length of the transistor M14' is set up in order that the transistor M14' may output the offset current $I_{offset}$.

When the high-order bit data of the grayscale data is '00', the switch SW14' is turned on and an offset current $I_{offset}$ is output, and when the high-order bit data is '01', the switch SW11' is turned on and the reference current IR1 which is 12 times the unit current $I_1$ is output.

When the high-order bit data is '10', the switches SW11' and SW12' are turned on, and the reference current IR2 shown in Equation 3 is output, and when the high-order bit data is '11', the switches SW11', SW12', and SW13' are turned on and the reference current IR3 shown in Equation 4 is output.

$$I_{R2}=12\times I_1+16\times I_2 \quad \text{[Equation 3]}$$

$$I_{R3}=12\times I_1+16\times I_2+16\times I_3 \quad \text{[Equation 4]}$$

The multiplexer 232' receives the high-order bit data of the grayscale data, selects a corresponding reference voltage from four reference voltages VR1' to VR4', and then transmits the selected reference voltage to the fine current output unit 233'. Here, the reference voltages VR1' to VR4' correspond to respective unit currents of the grayscale sections.

The fine current output unit 233' includes eight transistors M21' to M28', eight first switches SW21' to SW28', and four second switches SW31' to SW34'.

The transistors M21' to M28' are respectively coupled to the power source VDD and the first switches SW21' to SW28', and are placed therebetween, and every adjacent two transistors are set up to output substantially the same current by the same reference voltage applied on each gate.

In more detail, the channel widths and the channel lengths of the transistors M21' and M22' are set up in order that the transistors M21' and M22' may each output the currents which are half of the unit current I corresponding to the reference voltage VR', and the channel widths and the channel lengths of the transistors M23' and M24' are set up in order that the transistors M23' and M24' may each output the currents which are substantially the same as the unit current I. The channel widths and the channel lengths of the transistors M25' and M26' are set up in order that the transistors M25' and M26' may each output the currents which are double the unit current, and the channel widths and the channel lengths of the transistors M27' and M28' are set up in order that the transistors M27' and M28' may each output the currents which are 4 times the unit current I.

The switches SW21' to SW28' are turned on in response to the low-order bit data of the grayscale data, and all the adjacent two switches are set up to be turned on/off simultaneously. For example, the switches SW21' and SW22' are turned on when the low-order bit data is '0001', and the switches SW25' and SW26' are turned on when the low-order bit data is '0011'.

The switches SW31' to SW34' are respectively coupled to one of the two adjacent transistors outputting the same current, and are controlled to be turned on/off by a control signal L2b. In the first grayscale section, the control signal L2b turns on the switches SW31' to SW33', and turns off the switch SW34'. In the second to the fourth grayscale sections, all the switches SW31' to SW34' are turned on.

According to the second embodiment of the present invention, the first grayscale section is divided into two sub-grayscale sections. In a lower grayscale section of the two sub-grayscale sections, the switches SW31' to SW34' are all turned off, whereas in the high grayscale section, the switches SW31' to SW33' are turned on.

Hereinafter, an exemplary operation of the D/A converter according to the second embodiment of the present invention will be described in more detail.

When the video signal is a grayscale data of 6 bits, the first grayscale section is divided into a first sub-grayscale section and a second sub-grayscale section by using the low-order bit data of the grayscale data, wherein, in the first grayscale section, the low-order bit data of the grayscale data is '0000' to '0111', and in the second grayscale section, the low-order bit data of the grayscale data is '1000' to '1111'.

In the first sub-grayscale section, the second switches SW31' to SW34' are turned off, and the first switches SW21' to SW28' are controlled according to the low-order bit data of the grayscale data, so that the current corresponding to the low-order bit data of the grayscale data is output. For example, when the low-order bit data is '0001', the switches SW21' and SW22' are turned on, and the current which is half of the unit current I may be output as the fine current $\Delta I$. When the low-order bit data is '0010', the switches SW23' and SW24' are turned on, and the current which is the same as the unit current I may be output as the fine current $\Delta I$. Here, since the switches SW31' and SW32' are turned off, they block the flow of currents from the transistors M22' and M24'.

In the second sub-grayscale section, the second switches SW31' to SW33' are turned on, and the first switches SW21' to SW28' are controlled according to the low-order bit data of the grayscale data, so that the current corresponding to the low-order bit data of the grayscale data is output. For example, when the low-order bit data is '1000', the switches SW21', SW22', SW25', and SW26' are turned on, and the current which is 5 times the unit current I may be output as the fine current $\Delta I$. When the low-order bit data is '1001', the switches SW23', SW24', SW25', and SW26' are turned on, and the current, which is 6 times the unit current I, may be output as the fine current $\Delta I$.

In other words, in the first sub-grayscale section, the second switches SW31' to SW34' are turned off, and half of the unit current (e.g., one of the 0.5I and 0.5I) is added to the fine current $\Delta I$ to be output every time the low-order bit data is increased by one. In the second sub-grayscale section, the second switches SW31' to SW33' are turned on, and a current being the same as the unit current (e.g., both of the 0.5I and 0.5I) is added to the fine current $\Delta I$ to be output every time the low-order bit data is increased by one. Thereby, a variation of the fine current to be output is respectively controlled with respect to the divided sub-grayscale sections of the grayscale data with different references.

Figure 8:
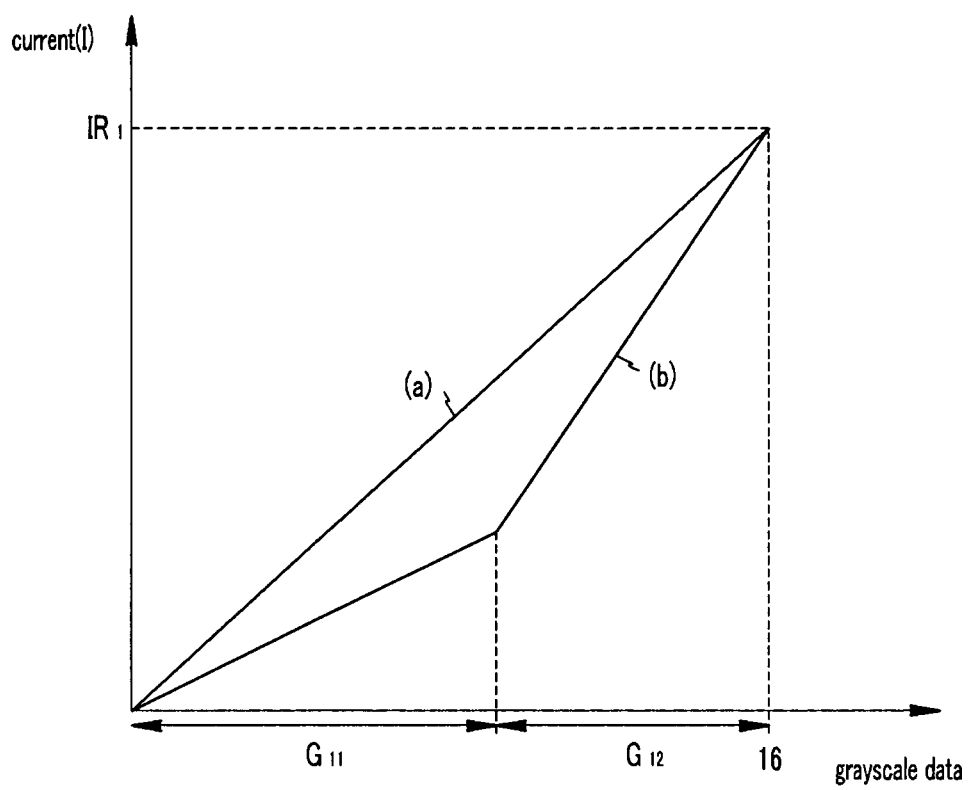
FIG. 8 shows a gamma curve in a first grayscale section according to the first and second embodiments of the present invention.

Accordingly, the gamma curve (b) in the first grayscale section becomes as shown in FIG. 8, and approaches nearer to the ideal gamma curve than the gamma curve (a) according to the first embodiment of the present invention does.

In the second to the fourth grayscale sections, all the second switches SW31' to SW34' are turned on, and the first switches SW21' to SW28' are operating substantially the same as in the first embodiment of the present invention because the two adjacent switches operate while coupled to each other.

Hereinafter, referring to FIG. 9, a D/A converter (e.g., the D/A converter $DAC_m$) according to a third embodiment of the present invention will be described.

Figure 9:
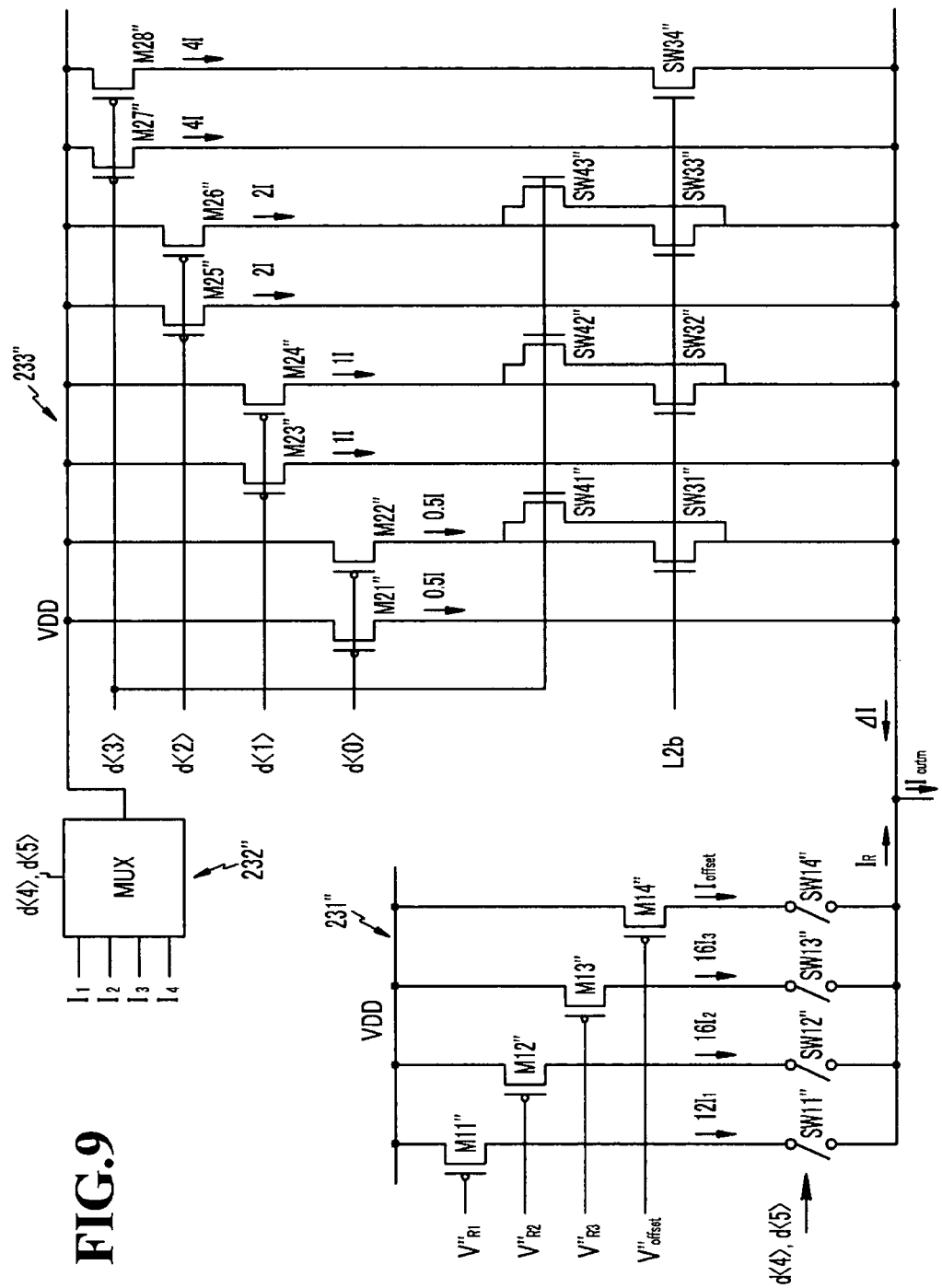
FIG. 9 is a circuit diagram showing a D/A converter according to a third embodiment of the present invention.

FIG. 9 is a circuit diagram showing the D/A converter according to the third embodiment of the present invention.

The D/A converter (e.g., the D/A converter $DAC_m$) according to the third embodiment of the present invention includes a reference current output unit 231", a multiplexer 232", and a fine current output unit 233".

The reference current output unit 231" includes four transistors M11" to M14", and four switches SW11" to SW14". Since the format and the operation of the reference current output unit 231" are substantially the same as those in the second embodiment of the present invention, a detailed description for the reference current output unit 231" will not be provided.

In the third embodiment, the multiplexer 232" receives unit currents $I_1$ to $I_4$, corresponding to the first to the fourth grayscale sections, and outputs one of the unit currents based on the high-order bit data of the grayscale data (i.e., two higher-most bits). In more detail, the unit current $I_1$ may be output when the high-order bit data is '00', and the unit current $I_4$ may be output when the high-order bit data of the grayscale data is '11'.

The fine current output unit 233" includes eight transistors M21" to M28", eight first switches SW21" to SW28", four second switches SW31" to SW34", and three third switches SW41" to SW43".

To the sources of the transistors M21" to M28", the unit current output from the multiplexer 232" is applied, and to the gates of the transistors M21" to M28", one of the low-order bits d<0> to d<3> of the grayscale data is applied. The channel widths and the channel lengths of the transistors M21" and M22" are set up in order that the transistors M21" and M22" may each output the currents, which are half of the unit current I, in response to the low-order bit data d<0>, and the channel widths and the channel lengths of the transistors M23" and M24" are set up in order that the transistors M23" and M24" may each output the currents, which are substantially the same as the unit current I, in response to the low-order bit data d<1>. The channel widths and the channel lengths of the transistors M25" and M26" are set up in order that the transistors M25" and M26" may each output the currents, which are double the unit current I, in response to the low-order bit data d<2>, and the channel widths and the channel lengths of the transistors M27" and M28" are set up in order that the transistors M27" and M28" may each output the currents, which are 4 times the unit current I, in response to the low-order bit data d<3>.

The switches SW41" to SW43" are respectively coupled to the transistors M22", M24", and M26", and are turned on/off according to the low-order bit data d<3>. In more detail, all the switches SW41" to SW43" are turned on when the low-order bit data d<3> is '1', whereas all the switches SW41" to SW43" are turned off when the low-order bit data d<3> is '0'. Therefore, with reference to the low-order bit of the grayscale data, the first grayscale section is divided into the first sub-grayscale section of the grayscale data and the second sub-grayscale section of the grayscale data by the operation of the switches SW41" to SW43". Then, in a lower grayscale section of the two sub-grayscale sections, a current variation according to the grayscale data is set to be smaller, whereas in the higher grayscale section, the current variation is set to be larger so that a more accurate gamma correction than in the first embodiment may be accomplished in the first grayscale section. In other words, a variation of the grayscale currents is respectively controlled with respect to the at least two sub-grayscale sections of the grayscale data with different references.

The switches SW31" to SW34" are respectively coupled to one of the two adjacent transistors outputting the same current (e.g., one of the transistors M22", M24", M26", and M28"), and are controlled to be turned on/off simultaneously by a control signal L2b. Here, the control signal L2b is determined according to the 2 high-most bits of the grayscale data. For example, the control signal L2b may be an off signal when the 2 high-most bits of the grayscale data are '00', and the control signal L2b may be an on signal when the 2 high-most bits of the grayscale data are not '00'; in other words, when they are '01', '10', or '11'. Therefore, in the second to the fourth grayscale sections, all the switches SW31" to SW34" are turned on, and the currents output from the transistors M21" to M28" are transmitted to an output terminal regardless of the switches SW41" to SW43" being turned on/off. In the first grayscale section, the switches SW31" to SW34" are all turned off, and the currents output from the transistors M21" to M28" are selectively transmitted to the output terminal depending on the switches SW41" to SW43" being turned on/off.

Consequently, in the D/A converter (e.g., the D/A converter $DAC_m$) shown in FIG. 9, the switches SW31" to SW34" are turned off only in the first grayscale section, and the first grayscale section is divided into the first sub-grayscale section and the second sub-grayscale section by the operation of the switches SW41" to SW43". Then, in a lower grayscale section of the two sub-grayscale sections, a current variation according to the grayscale data is set to be smaller, whereas in the higher grayscale section, the current variation is set to be larger so that the more accurate gamma correction than in first embodiment may be accomplished in the first grayscale section.

In view of the foregoing, a D/A converter and a display device using the same for generating a grayscale current according to an embodiment of the present invention have been described. The embodiments described above are exemplary embodiments which reflect a concept of the present invention; however, it should be understood that the present invention is not limited thereto since various modifications and/or variations may be readily understood by a person skilled in the art to be within the spirit and scope of the present invention.

Figure 7:
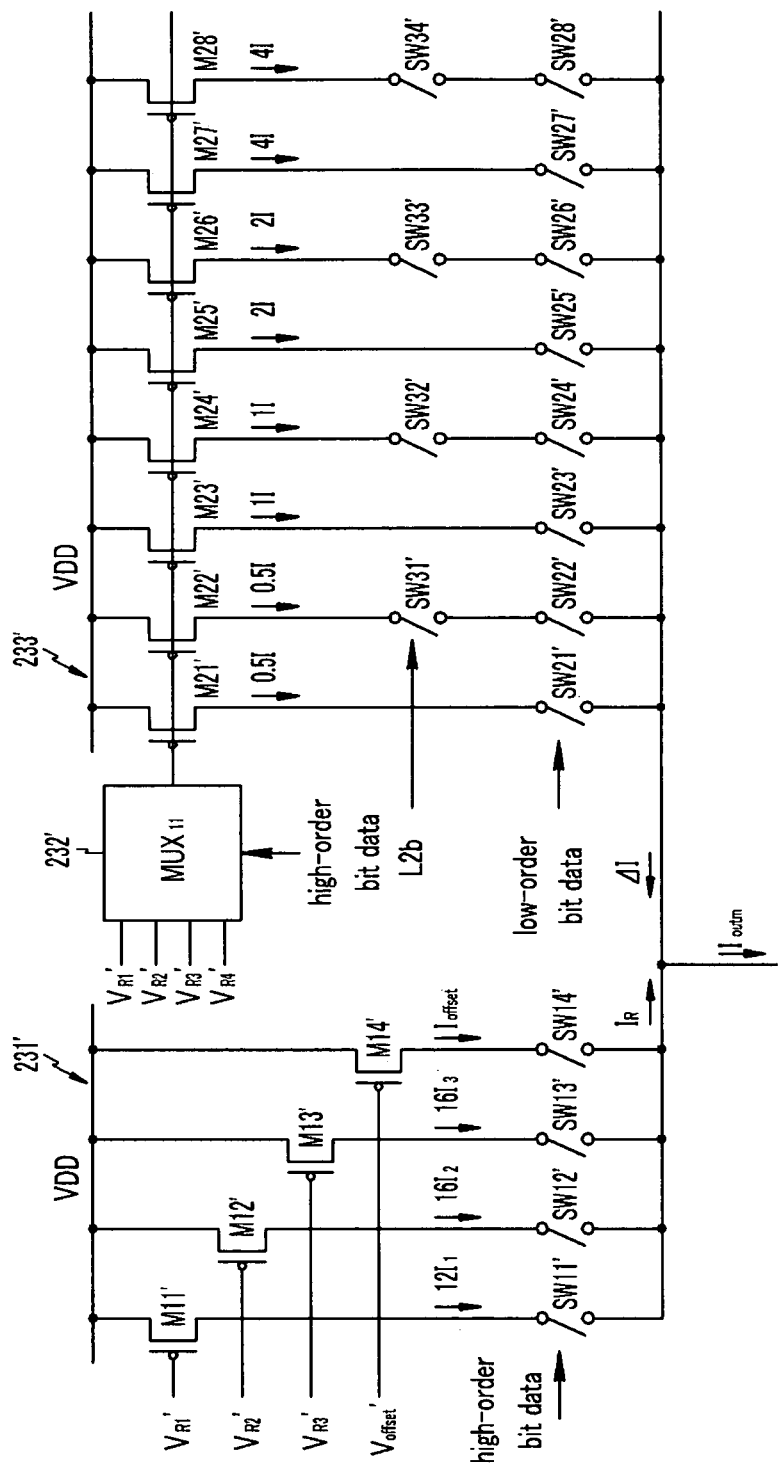
FIG. 7 is a circuit diagram showing a D/A converter according to a second embodiment of the present invention.

For example, in FIG. 6, FIG. 7, and FIG. 9, it is described that the transistors are P-type channel transistors (e.g., PMOS transistors), and the power voltage VDD is applied to the source thereof. However, the scope of the present invention is not limited to a specified channel type of the transistor, and a transistor of an N-type channel (e.g., a NMOS transistor) can be used according to various embodiments.

In addition, although a case in which a first grayscale section is divided in two sub-grayscale sections has been described, it should be understood that second to fourth grayscale sections may be also divided into a plurality of sub-grayscale sections according to various embodiments, and a gamma correction may be performed thereby.

According to the present invention, a plurality of grayscale data are divided into at least two grayscale sections, a reference current is output by using a high-order bit data of a grayscale data, and a fine current is output for the corresponding grayscale section by using a low-order bit data, so that a gamma corrected grayscale current may be output.

While this invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A display device comprising:
    a display unit comprising a plurality of data lines for transmitting data currents, a plurality of scan lines for transmitting selection signals, and a plurality of pixel areas defined by the data lines and the scan lines;
    a data driver for dividing a plurality of grayscale data into at least two grayscale sections, converting at least one of the plurality of grayscale data into at least one of the data currents, and applying the at least one of the data currents to at least one of the data lines, each of the plurality of grayscale data comprising a high-order bit data and a low-order bit data; and
    a scan driver for sequentially applying the selection signals to the plurality of scan lines,
    wherein the data driver is configured to output a first current corresponding to a first grayscale section of the at least two grayscale sections by utilizing the high-order bit data, the first grayscale section being indicated by the at least one of the plurality of grayscale data,
    wherein the data driver is configured to output a second current corresponding to the first grayscale section by utilizing the high-order bit data to select a reference signal, and utilizing the low-order bit data and the selected reference signal to control current variations for the second current, wherein the data driver is configured to divide the first grayscale section into a first sub-grayscale section and a second sub-grayscale section by utilizing the low-order bit data, a first group of the grayscale data corresponding to the first sub-grayscale section and a second group of the grayscale data corresponding to the second sub-grayscale section, and to control current variations for the second current with respect to the first sub-grayscale section and the second sub-grayscale section, respectively, to be different in accordance with the same selected reference signal, and wherein the data driver is configured to output the at least one of the data currents as a sum of the first current and the second current.

2. The display device of claim 1, wherein the first current is an initial current for the first grayscale section.

3. The display device of claim 1, wherein the first grayscale section is a lowermost grayscale section among the at least two grayscale sections.

4. The display device of claim 3, wherein, in the first grayscale section, the first group of the grayscale data is a low grayscale data group, and the second group of the grayscale data is a high grayscale data group.

5. The display device of claim 4, wherein the current variations of the second current for the second group of the grayscale data is set to be double the current variations of the second current for the first group of the grayscale data.

6. The display device of claim 1, wherein the data driver comprises:
a shift register for receiving a first signal and a clock signal, and shifting the first signal in synchronization with the clock signal into a plurality of shifted signals;
a latch for latching the plurality of grayscale data in synchronization with the shifted signals from the shift register; and
a grayscale current generator for converting the plurality of grayscale data output from the latch into the data currents and outputting the data currents.

7. The display device of claim 6, wherein the grayscale current generator comprises:
a first current output unit for outputting the first current corresponding to the first grayscale section by utilizing the high-order bit data;
a multiplexer for selecting a first reference voltage corresponding to the first grayscale section from a plurality of first voltages respectively corresponding to unit currents of the at least two grayscale sections and outputting the first reference voltage; and
a second current output unit for setting up the variations of the second current according to the low-order bit data in the first group of the grayscale data and the second group of the grayscale data, and outputting the second current by utilizing the low-order bit data and the first reference voltage output from the multiplexer.

8. The display device of claim 7, wherein the first current output unit comprises:
a plurality of first transistors for respectively outputting a plurality of third currents corresponding to a second voltage; and
a plurality of first switches for responding to the high-order bit data and outputting the third currents from the first transistors as the first current.

9. The display device of claim 8, wherein:
the second voltage is substantially the same as the first reference voltage;
the third currents are substantially the same as respective current periods of the at least two grayscale sections; and
the first current is substantially the same as a sum of the third currents.

10. The display device of claim 7, wherein the second current output unit comprises:
a plurality of transistor groups, each of the transistor groups comprising at least two transistors, the at least two transistors being for respectively outputting fourth currents in response to the first reference voltage output by the multiplexer, the fourth currents of each of the transistor groups being substantially the same to each other;
a plurality of second switches for responding to the low-order bit data and outputting currents of the transistors from the transistor groups as the second current; and
a third switch being coupled with one of the at least two transistors in each of the transistor groups and a corresponding one of the second switches.

11. The display device of claim 10, wherein currents output from the respective transistor groups are set to be different from each other.

12. The display device of claim 10, wherein corresponding ones of the second switches for outputting the fourth currents of the at least two transistors included in one of the transistor groups are turned on concurrently.

13. The display device of claim 10, wherein the third switch in each of the transistor groups is controlled to be all turned off when the grayscale data in the first group of the grayscale data is input, and the third switch in some of the transistor groups is controlled to be turned on when the grayscale data of the second group of the grayscale data is input.

14. The display device of claim 13, wherein the third switch in each of the transistor groups is controlled to be turned on in all of the at least two grayscale sections except the first grayscale section.

15. A display panel comprising:
a display unit comprising a plurality of pixels for displaying images according to an applied data current; and
a grayscale current generator for dividing a plurality of grayscale data into at least two grayscale sections, converting at least one of the plurality of grayscale data into the data current, and applying the data current to a data line, each of the plurality of grayscale data comprising a high-order bit data and a low-order bit data,
wherein the grayscale current generator is configured to generate a first current corresponding to a first grayscale section of the at least two grayscale sections by utilizing the high-order bit data, the first grayscale section being indicated by the at least one of the plurality of grayscale data, and
the grayscale current generator is configured to generate a second current corresponding to the first grayscale section by utilizing the high-order bit data to select a reference signal, and utilizing the low-order bit data and the selected reference signal to control current variations for the second current, wherein the grayscale current generator is configured to divide the first grayscale section into at least two sub-grayscale sections of the grayscale data by utilizing the low-order bit data, and to control current variations for the second current with respect to the at least two sub-grayscale sections of the grayscale data, respectively, to be different while using the same selected reference signal, and
wherein the grayscale current generator is configured to output the data current as a sum of the first current and the second current.

16. The display panel of claim 15, wherein the first current is an initial current for the first grayscale section, and the variations of the second current correspond to the low-order bit data.

17. The display panel of claim 15, wherein, among the at least two sub-grayscale sections, a variation of the second current in a low grayscale section of the at least two sub-grayscale sections is controlled to be smaller than a variation in a high grayscale section of the at least two sub-grayscale sections.

18. The display panel of claim 17, wherein the grayscale current generator comprises:
a first current output unit for outputting the first current corresponding to the first grayscale section by utilizing the high-order bit data;
a multiplexer for selecting a first reference voltage corresponding to the first grayscale section from a plurality of first voltages respectively corresponding to unit currents of the at least two grayscale sections and outputting the first reference voltage; and
a second current output unit for setting up the variations of the second current in the at least two sub-grayscale sections, and outputting the second current by utilizing the low-order bit data and the first reference voltage output from the multiplexer.

19. A driving method of a display panel in which a plurality of pixel circuits for displaying images in response to an input data current are formed, wherein a plurality of grayscale data are divided into at least two grayscale sections comprising a first grayscale section, each of the grayscale data comprising a high-order bit data and a low-order bit data, and the first grayscale section is divided into at least two sub-grayscale sections by utilizing the low-order bit, the method comprising:
generating a first current corresponding to the first grayscale section to which at least one of the plurality of grayscale data belongs by utilizing the high-order bit data of the grayscale data;
selectively outputting a first reference signal of the first grayscale section among first signals respectively corresponding to the at least two grayscale sections by utilizing the high-order bit data of the grayscale data;
generating a third current corresponding to the first reference signal and generating a second current by utilizing the third current and the low-order bit data of the grayscale data controlling current variations for the second current with respect to the at least two sub-grayscale sections of the grayscale data, respectively, to be different while using the same first reference signal; and
outputting the data current as a sum of the first current and the second current, wherein variations for the second current are controlled with respect to the at least two sub-grayscale sections of the grayscale data, respectively, with different references by utilizing the low-order bit data.

20. The driving method of claim 19, wherein the first reference signal is a voltage corresponding to a unit current of the first grayscale section.

* * * * *

UNITED STATES PATENT AND TRADEMARK OFFICE
CERTIFICATE OF CORRECTION

| | | |
|---|---|---|
| PATENT NO. | : 8,570,253 B2 | |
| APPLICATION NO. | : 11/229127 | |
| DATED | : October 29, 2013 | |
| INVENTOR(S) | : Oh Kyong Kwon | |

It is certified that error appears in the above-identified patent and that said Letters Patent is hereby corrected as shown below:

In the Claims

Column 16, Claim 10, line 10    Delete "to"
                                Insert -- as --

Column 18, Claim 19, line 16    Delete "data"
                                Insert -- data; --

Signed and Sealed this
Fifth Day of May, 2015

Michelle K. Lee
*Director of the United States Patent and Trademark Office*